United States Patent [19]

Suzuki et al.

[11] Patent Number: 4,755,036

[45] Date of Patent: Jul. 5, 1988

[54] APPARATUS FOR DEFLECTING LIGHT BEAM

[75] Inventors: Makoto Suzuki; Kazunari Taki, both of Nagoya, Japan

[73] Assignee: Brother Kogyo Kabushiki Kaisha, Aichi, Japan

[21] Appl. No.: 825,994

[22] Filed: Feb. 4, 1986

[30] Foreign Application Priority Data

| Feb. 7, 1985 | [JP] | Japan | 60-22467 |
| Feb. 7, 1985 | [JP] | Japan | 60-22468 |
| Feb. 7, 1985 | [JP] | Japan | 60-22469 |

[51] Int. Cl.$^4$ .............................................. G02B 6/10
[52] U.S. Cl. ..................... 350/96.13; 350/96.14; 350/355; 350/356; 350/358; 350/359; 350/360
[58] Field of Search ............... 350/96.10, 96.11, 96.12, 350/96.13, 96.14, 96.15, 96.18, 355, 356, 358, 370, 371, 359, 360

[56] References Cited

U.S. PATENT DOCUMENTS

| 3,795,433 | 3/1974 | Channin | 350/96.14 X |
| 4,070,092 | 1/1978 | Burns | 350/96.14 X |
| 4,175,827 | 11/1979 | McMahon | 350/96.14 |
| 4,348,079 | 9/1982 | Johnson | 350/358 |
| 4,413,270 | 11/1983 | Sprague | 346/160 |
| 4,425,023 | 1/1984 | Matsumoto et al. | 350/96.14 |
| 4,470,661 | 9/1984 | Matsumoto | 350/96.13 |
| 4,478,483 | 10/1984 | Sprague | 350/96.14 |
| 4,548,464 | 10/1985 | Auracher et al. | 350/96.14 |
| 4,611,883 | 9/1986 | Myer | 350/96.15 X |
| 4,614,408 | 9/1986 | Mir et al. | 350/96.14 X |
| 4,637,681 | 1/1987 | Yamamoto et al. | 350/96.12 |
| 4,705,346 | 11/1987 | Miyawaki | 350/96.14 |
| 4,707,059 | 11/1987 | Ogura et al. | 350/96.13 |

FOREIGN PATENT DOCUMENTS

| 0021993 | 1/1981 | European Pat. Off. | 350/96.18 |
| 0021510 | 1/1981 | European Pat. Off. | 350/96.10 X |
| 0048441 | 3/1982 | European Pat. Off. | 350/96.10 X |
| 2359797 | 6/1975 | Fed. Rep. of Germany | 350/96.14 X |
| 3102972 | 11/1981 | Fed. Rep. of Germany | 350/96.14 X |
| 3443863 | 6/1985 | Fed. Rep. of Germany | 350/96.14 X |
| 51-8949 | 1/1976 | Japan | 346/103 X |
| 54-150153 | 11/1979 | Japan | 350/358 |
| 58-125025 | 7/1983 | Japan | 350/358 |
| 58-147718 | 9/1983 | Japan | 350/96.13 |
| 59-204027 | 11/1984 | Japan | 350/96.14 X |

OTHER PUBLICATIONS

Takizawa, "Electrooptical Fresnel Lens . . . ", Applied Optics, vol. 22, No. 16, 8/83, pp. 2468-2473.
Kazumasa Mitsunaga et al., "Optical Waveguide Isolator in Ti-Diffused LiNbO$_3$", Optics Communications, vol. 27, No. 3, Dec. 1978, pp. 361-364.
J. Y. Tsao et al., "Photodeposition of Ti and Application to Direct Writing of Ti:LiNbO$_3$", Appl. Phys. Lett., 42 (7), Apr. 1, 1983, pp. 559-561.

Primary Examiner—William L. Sikes
Assistant Examiner—Brian M. Healy
Attorney, Agent, or Firm—Parkhurst & Oliff

[57] ABSTRACT

An optical deflector including a waveguide which has an electrooptic effect and which is adapted to guide rays of light therethrough. The deflector comprises a deflector portion having deflection electrodes disposed on a portion of the waveguide and spaced apart in a selected direction intersecting a direction of propagation of the light. The deflector further comprises a controller for applying deflection voltages to the deflection electrodes to establish a distribution of refractive index of the above-indicated portion of the waveguide in the above selected direction. The controller periodically changes the deflection voltages to vary the refractive index distribution, thereby deflecting the light passing through the waveguide. The waveguide may be formed on a surface of a substrate made of an electrooptic material. The substrate may have a converging portion including convergence electrodes disposed on another portion of the waveguide, to converge the rays of light deflected by the deflector portion, convergence voltages to be applied to the convergence electrodes being varied according to an angle of deflection of the rays, to permit the convergence of the rays on a surface of an object irrespective of the deflection angle.

8 Claims, 15 Drawing Sheets

APPARATUS FOR DEFLECTING LIGHT BEAM

BACKGROUND OF THE INVENTION

The present invention relates in general to an optical deflector device using a solid deflector for deflecting a light beam, and more particularly to an art of deflecting a light beam in a waveguide formed of an electrooptic material, by utilizing the electrooptic effect of the electrooptic material.

An optical device for deflecting a light beam within a given angular range is used in various devices such as a laser-beam printer that uses a low-power laser to produce image-forming charges, and a bar code reader that reads combinations of printed bars. Known as typical examples of such a light deflector are a polygon mirror and a hologram scanner. These deflectors employ mechanical moving parts such as a rotary mechanism and a device for driving the rotary mechanism. Thus, these deflector devices using such mechanical parts tend to be complicated in construction, large-sized, and are not satisfactory in duration.

In view of the above inconveniences encountered in the prior art light deflecting devices, it is considered possible to use a solid deflector element which employs a transparent substrate of $LiNbO_3$, $SiO_2$, etc. On one of opposite primary surfaces of the substrate, a two-dimensional waveguide is formed to guide or conduct waves of a light beam. For improved operation of the deflector, it is considered desirable to provide the waveguide with a portion which functions as a concave lens. Described more specifically, such a two-dimensional waveguide formed on the substrate incorporates a deflector of various types for deflecting a beam of light, utilizing the electrooptic effect, or the effect of ultrasonic light diffraction. However, the deflecting capability of such a deflector portion of the waveguide is limited. For this reason, it is considered necessary to form the waveguide with an integral concave-lens portion which is located downstream of the deflector portion, to receive the light beam deflected by the deflector portion, and to boost or amplify an angle of deflection of the light beam. However, the concave-lens portion or deflection-amplifying portion tends to enlarge the substrate. Although it seems possible to substitute a separate concave lens for the integral concave-lens portion, the size of the deflector device as a whole is also increased.

SUMMARY OF THE INVENTION

It is accordingly an object of the present invention to provide an optical deflector device for deflecting a beam of light, which is compact and durable.

Another object of the invention is to provide a method of forming an electrooptic substrate with a two-dimensional waveguide including a deflection-amplifying portion which serves as a concave lens to amplify an angle of deflection of the light which is obtained by a deflector portion located upstream of the deflection-amplifying portion.

According to the present invention, there is provided an optical deflector device including a waveguide which has an electrooptic effect and which is adapted to guide waves of a light beam therethrough, the optical deflector comprising a plurality of electrodes which are disposed on a portion of the waveguide and are spaced apart from each other in a predetermined direction intersecting a direction of propagation of the light beam. The deflector device further comprises control means for applying voltages to the plurality of electrodes to establish a distribution of a refractive index of the above-indicated portion of the waveguide in the predetermined direction. The control means is adapted to vary the voltages as a function of time to vary the distribution of the refractive index, thereby deflecting the light beam passing through the waveguide, within a predetermined range of angle corresponding to a variation in the voltages.

In the optical deflector device of the present invention constructed as described above, the voltages applied to the electrodes produce an electric field at the portion of the waveguide of the electrooptic material on which the electrodes are disposed, whereby that portion of the waveguide exposed to the electric field has a distribution of refractive index which corresponds to a distribution of a magnitude of the electric field. Therefore, the light beam passing through the above-indicated portion of the waveguide is deflected by an angle corresponding to the currently established distribution of refractive index. Further, the angle of deflection of the light beam can be changed by varying the level of the voltages as a function of time.

As indicated above, the instant deflector device does not use any mechanical moving parts such as a rotary mechanism and a drive device for operating the rotary mechanism, as used in the conventional counterpart. Accordingly, the instant device is simplified in construction, reduced in size and improved in durability. In addition, since the deflection angle can be changed by varying the voltages to be applied to the electrodes, a desired angular range of deflection of the light can be easily established by selecting a suitable waveform of the voltage signal to be supplied from the control means to the electrodes.

According to another aspect of the invention, there is provided an optical deflector device for deflecting a light beam from a light source, within a predetermined angular range, comprising: (a) a substrate having a waveguide on one of its opposite surfaces, the waveguide having an electrooptic effect and guiding the light beam transmitted from the light source; (b) a condenser portion provided in the waveguide for condensing a radiation of the light beam from the light source, into parallel rays; (c) a deflector portion provided in the waveguide for deflecting the parallel rays, within the predetermined angular range; (d) a converging portion comprising a plurality of mutually spaced-apart convergence electrodes disposed on the waveguide, to converge the deflected parallel rays; and (e) control means for applying convergence voltages to the convergence electrodes. The convergence voltages are varied as a function of time to adjust a focal length of the converging portion according to an angle of deflection of the parallel rays by the deflector portion, so that the deflected parallel rays are converged on a surface of an object, irrespective of the angle of deflection.

In the optical deflector device constructed as described above, the rays of light emitted from the light source are condensed into parallel rays by the condenser portion, and deflected by a given angle by the deflector portion. The deflected rays of light are converged by the converging portion, such that its focal length is adjusted according to the angle of deflection at the deflector portion. This adjustment is effected by varying the convergence voltages to be applied to the convergence electrodes, according to the deflection angle. Therefore, the deflected rays can be converged on a surface of an object, irrespective of the deflection angle. According to the instant arrangement, the condenser portion, deflector portion and the converging portion are formed as integral portions of the waveguide which is provided on one of opposite surfaces of the single substrate made of an electrooptic material. Thus, the instant deflector arrangement does not incorporate any mechanical moving parts such as a rotary mechanism and a drive device for operating the rotary mechanism, nor any discrete optical lenses. Accordingly, the deflector device is simple in structure, small-sized, and improved in operating reliability and durability.

According to one advantageous embodiment of the above aspect of the present invention, the deflector device further comprises a deflection-amplifying portion, disposed between the deflector portion and the converging portion, in order to amplify or boost the angle of deflection of the parallel rays by the deflector portion. This deflection-amplifying portion is constituted by a portion of the waveguide whose refractive index is varied so that the deflection-amplifying portion functions as a concave lens. In a preferred form of this embodiment, the above-indicated portion of the waveguide which constitutes the deflection-amplifying portion is formed such that its refractive index increases in opposite transverse directions of the waveguide, away from an optical axis of the light beam (centerline of the waveguide parallel to the line of propagation of the light beam).

According to another embodiment of the invention, the deflector portion comprises a plurality of mutually spaced-apart deflection electrodes disposed on a portion of the waveguide. The deflector device further comprises another control means for applying deflection voltages to the deflection electrodes to produce an electric field for establishing a distribution of a refractive index of the above-indicated portion of the waveguide in a transverse direction of the waveguide. This refractive index distribution corresponds to a distribution of a magnitude of the electric field due to the electrooptic effect of the waveguide. This latter control means changes the deflection voltages as a function of time to vary the distribution of the refractive index, to thereby deflect the light beam within the predetermined angular range.

In accordance with an alternative advantageous embodiment of the invention, the deflector portion comprises an oscillator for generating elastic surface waves (ultrasonic waves) to which a portion of the waveguide is exposed. In this case, another control means is provided for changing periodically a frequency of the elastic surface waves to effect a periodic variation in refractive index of the above-indicated portion of the waveguide, in timed relation with the frequency of the elastic surface waves. The periodic variation in the refractive index causes a variation in angle of Bragg diffraction of the parallel rays. As a result, an angle of deflection of the parallel rays by the deflector portion is varied with the frequency of the elastic surface waves.

According to a further embodiment of the invention, the mutually spaced-apart convergence electrodes of the converging portion are disposed on a portion of the waveguide and spaced apart a predetermined distance from each other in a predetermined direction intersecting a direction of propagation of the light beam through the waveguide. The convergence voltages establish, due to the electrooptic effect of the waveguide, a sawtooth distribution of a refractive index of the portion of the waveguide in the predetermined direction. The control means varies the convergence voltages to change the sawtooth distribution of the refractive index. Therefore, the focal length of the converging portion is adjusted according to a variation in the convergence voltages.

In accordance with a still further embodiment of the invention, the converging portion comprises a radial aarray of a plurality of three-dimensional waveguides which are disposed radially so as to cover the predetermined angular range. The mutually spaced-apart convergence electrodes are arranged such that portions of the three-dimensional waveguides are exposed to electric fields which are produced by the convergence electrodes by application of the convergence voltages thereto. The convergence voltages are varied to change magnitudes of the electric fields and to thereby change distributions of refractive indexes of the above-indicated portions of the three-dimensional waveguides. Consequently, the beams of light emitted from the three-dimensional waveguides are focused or concentrated on the object surface.

According to a further aspect of the present invention, there is provided a method of forming a two-dimensional waveguide adjacent to one of opposite surfaces of a transparent substrate, the wave guide being adapted to guide waves of a light beam therethrough and capable of serving as a concave lens for refracting the light beam, comprising the steps of: (a) depositing a diffusion material, different from a material of the substrate, on an area of the above-identified one surface of the substrate corresponding to at least a part of the two-dimensional waveguide; and (b) subjecting the substrate with the deposited diffusion material to a diffusion process to effect diffusion of diffusion material through a portion of the substrate adjacent to the above-indicated area of the substrate. A thickness of the deposited diffusion material on the above-indicated area of the surface of the substrate is varied in a predetermined direction intersecting a direction of propagation of the light beam through the waveguide, so as to give the above-identified portion of the substrate a refractive index which increases in opposite directions parallel to the above-indicated predetermined direction, away from an optical axis of the light beam, in a plane parallel to the surface of the substrate.

In the method of the invention as described above, the diffusion of the diffusion material which is deposited as indicated above will cause the portion of the substrate corresponding to at least a part of the waveguide to have a refractive index which increases away from the optical axis (centerline of the waveguide), along a line intersecting the line of propagation of the light through the waveguide, and in a plane parallel to the substrate. Thus, the instant method facilitates the formation of the waveguide which is capable of functioning as a concave lens for refracting the light beam while it passes through the above-indicated portion of the waveguide. Therefore, when a deflector portion is formed upstream of this concave-lens portion of the waveguide, the light beam passing through the waveguide is deflected by a comparatively large angle. Namely, the concave-lens portion, which is an integral part of the substrate, may serve as a deflection-amplifying portion for boosting the angle of deflection by the delector portion.

The principle of the invention, to form a waveguide with an integral concave-lens portion by the diffusion of a suitable material, can be practiced even when the substrate is made of a tranparent material other than an electrooptic material.

Further, the diffusion material may be either a material whose diffusion through the substrate will cause an increase in the refractive index of the waveguide (substrate), or a material whose diffusion will reduce the refractive index of the waveguide. Examples of the materials which increase the refractive index of the waveguide include titanium (Ti), niobium (Nb), vanadium (V), nickel (Ni) and copper (Cu). In the case where these materials are emloyed as the diffusion material, the thickness of the diffusion material to be deposited on the substrate is varied so that the concentration of the diffusion material diffused through the waveguide increases in opposite directions away from the optical axis of the light beam passing through the waveguide. In the meantime, if boron (B) or other diffusion material whose diffusion results in reduction in the refractive index of the waveguide is used, the thickness of the diffusion material is varied so that the concentration of the diffused material increases in opposite directions toward the optical axis.

The application of the diffusion material to the substate may be accomplished after the substrate is processed to provide a layer for the waveguide which has a higher refractive index than the remaining portion of the substrate. In this case, the diffusion material is applied only to a portion of the previously formed waveguide layer, so as to give that portion of the layer a concave-lens function. Alternatively, the diffusion material may be applied to the substrate which has not been processed to provide a waveguide layer. In this latter case, the diffusion material for forming the waveguide with a higher refractive index, and the diffusion material for forming a concave-lens portion of the waveguide, are simultaneously applied to the substrate.

BRIEF DESCRIPTION OF THE DRAWINGS

The above and other objects, features and advantages of the present invention will become more apparent from reading the following detailed description of preferred embodiments of the invention, when considered in connection with the accompanying drawings in which.

DETAILED DESCRIPTION OF THE PREFERRED EMBODIMENTS

To further clarify the concept of the present invention, several embodiments of the invention will be described in detail, by reference to the accompanying drawings.

Figure 1:
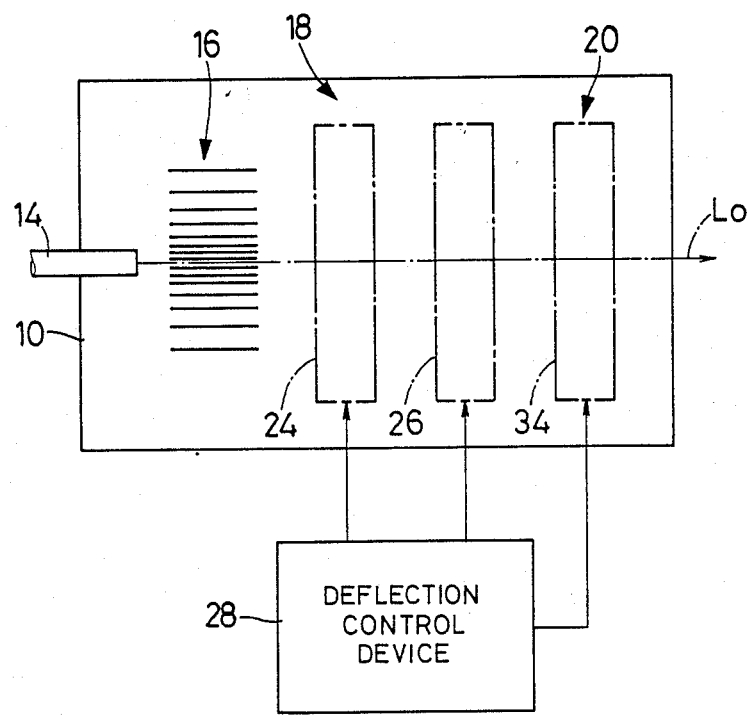
FIGS. 1 and 2 are a plan view and a side elevational view, respectively, of one embodiment of an optical deflector device of the present invention.
Figure 2:
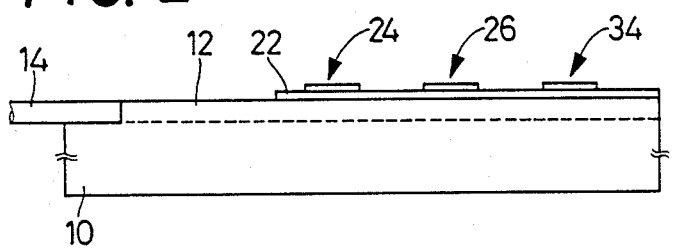
Figure 3:
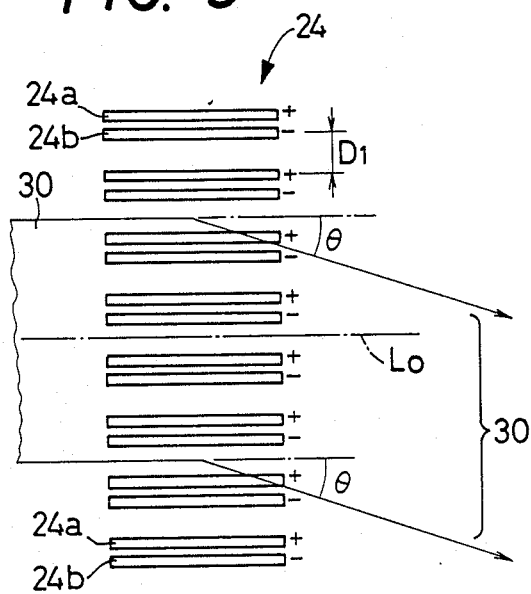
FIG. 3 is a fragmentary view of the deflector device of FIGS. 1 and 2, showing an arrangement of a deflector of a deflector portion of the deflector device.

Referring first to FIGS. 1 and 2, there is illustrated a rectangular substrate 10 which is made of an electrooptic material such as a crystal of LiNbO$_3$, and which has a thickness of about 0.5 mm, for example. On one of opposite major surfaces of the electrooptic substrate 10, there is provided a waveguide 12 which is formed as a thin layer of a material that has a higher refractive index (index of refraction) than the electrooptic material of the substrate 10. The higher refractive index of this thin layer serves to give the waveguide 12 a characteristic that permits waves of a light beam to be trapped in the direction of thickness of the waveguide 12, whereby the wave of the light beam are properly guided or conducted through the interior of the waveguide 12. For example, the layer of the waveguide 12 is formed, with a comparatively small thickness of several microns, by diffusion of a suitable material such as Ti (titanium) through the electrooptic material adjacent to the surface of the substrate 10. The substrate 10 and the layer of the waveguide 12 are integral with each other, and the refractive index is varied continuously across the interface or boundary of the substrate 10 and the waveguide layer. The boundary is indicated in broken line in FIG. 2.

An optical fiber 14 is connected to one end of the waveguide 12, to introduce a laser beam into the waveguide 12. The laser beam radiation from the end of the optical fiber 14 is condensed into parallel rays while passing through a condenser portion 16 which is formed in the waveguide 12, near the end of the optical fiber 14. The parallel rays are then transmitted through a deflector portion 18, so that the rays are deflected. The thus deflected parallel rays are then converged by a converging portion 20, i.e., focused at a desired point after the passage through the converging portion 20.

Described in greater detail, the condenser portion 16 is formed parallel to the surface of the substrate 10, so as to extend at right angles to an optical axis Lo of the laser beam, by means of diffusion of a suitable material such as titanium through the substrate 10, such that the diffusion density or the concentration of the diffused material is increased in opposite directions toward the optical axis Lo. In other words, the refractive index of the condenser portion 16 in the waveguide 12 is increased in the directions toward the optical axis Lo. The thus formed condenser portion 16 functions as a convex lens. A spaced-apart succession of straight lines indicated in FIG. 1 represents the condenser portion 16. The density of the straight lines represents the distribution of the refractive index. While the condenser portion 16 is formed as described above, it may be replaced by other means such as a geodesic lens provided in the form of a concave cavity formed in the surface of the waveguide 12.

The deflector portion 18 and the converging portion 20 are formed with arrays of multiple electrodes disposed on a buffer layer 22 formed on the waveguide 12. The buffer layer 22 is a layer of several microns which is made of a transparent material such as SiO$_2$ having a lower refractive index that the material of the waveguide 12. The buffer layer 22 is provided for preventing the above-indicated electrode from absorbing the energy of the light passing through the waveguide 12. However, the buffer layer 22 may be eliminated.

To assume a sufficient angle of deflection of the light, the deflector portion 18 consists of a pair of deflectors 24, 26 which are identical with each other in construction. In the interest of brevity, only the first deflector 24 will be described.

Figure 4:
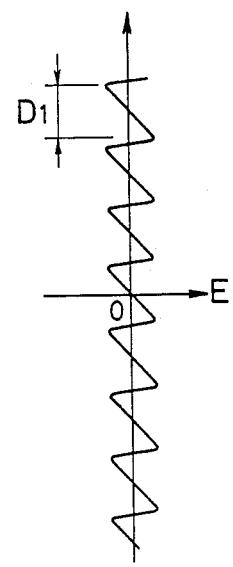
FIG. 4 is an illustration showing one form of electric field distribution of the deflector of FIG. 3.

The deflector 24 consists of multiple pairs of deflection electrodes 24a, 24b which are spaced apart a short distance from each other in parallel relation. The multiple electrode piars are disposed parallel to the surface of the substrate 10, and are spaced apart by a suitable distance D1 from each other in the direction perpendicular to the optical axis Lo. The electrodes 24a of the multiple pairs are connected to each other while the electrodes 24b of the pairs are connected to each other. The electrodes 24a and the electrodes 24b are connected to a deflection control device 28, so that deflection voltages of the same level are applied to the electrodes 24a and to the electrodes 24b. In this arrangement, an electric field E is produced upon application of the deflection voltage to the electrodes 24a, 24b. A distribution of the magnitude of the electric field E in the direction perpendicular to the optical axis Lo is represented by a sawtooth form of FIG. 4. The saw teeth correspond to the positions of the individual multiple pairs of electrodes 24a, 24b. Generally, an electrooptic material has a property of changing the refractive index according to a variation in the magnitude of an electric field produced. This is referred to as the electrooptic effect. A variation $\Delta n$ in refractive index of the portions of the waveguide 12 located between the electrodes 24a, 24b of the multiple pairs is expressed by the following formula (1), if the substrate is made of LiNbO$_3$, for example:

$$\Delta n = (\tfrac{1}{2}) n_e^3 \, r_{33} \cdot E \tag{1}$$

where, $n_e$: refractive index of the substrate 10 with respect to abnormal light;

$r_{33}$: electrooptic constant of the substrate 10 in the direction of thickness.

Namely, the distribution of the refractive index in the direction perpendicular to the optical axis Lo, that is, the distribution of the variation $\Delta n$ in the refractive index, corresponds to the distribution of the magnitude of the electric field E which is represented by a sawtooth form, each tooth having a predetermined angle of slope.

Figure 5:
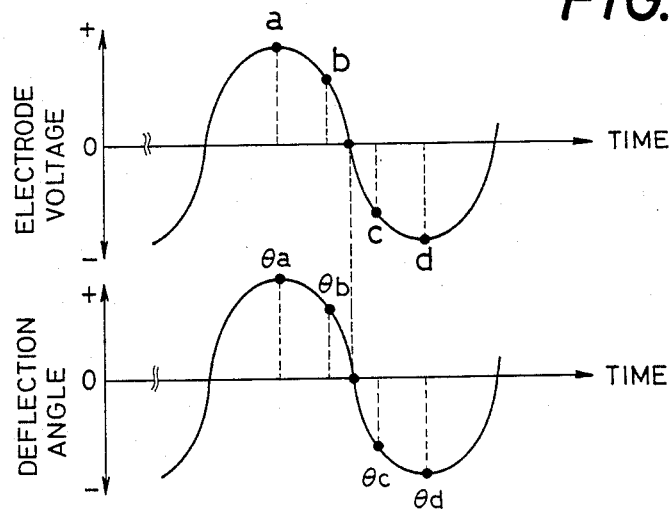
FIG. 5 is a time chart indicating a variation in voltage applied between electrodes of the deflector, and a variation in angle of deflection of a light beam by the deflector.
Figures 6, 7, 8, 9:
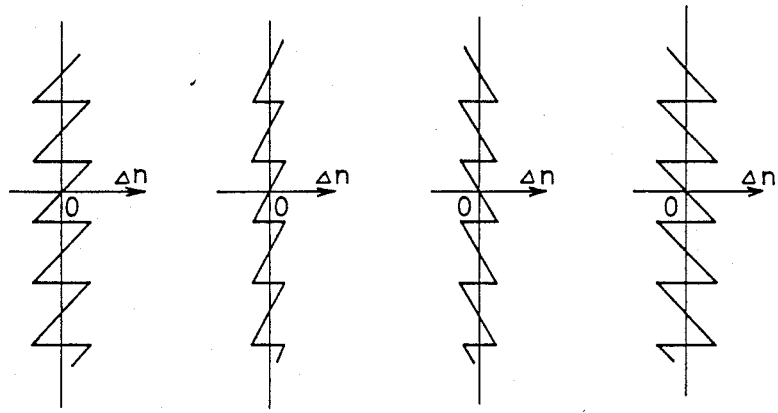
FIG. 6 through FIG. 9 are graphical illustrations indicating variations in refractive index of the light beam at points (a) through (d) on a voltage curve of FIG. 5, respectively, of the deflector of FIG. 3.

Consequently, as the deflection voltages to be applied to the electrodes 24a, 24b are varied with time as indicated by an upper graph in FIG. 5, an angle $\theta$ of deflection of the light is varied in synchronization with a variation in the voltage level, as indicated by a lower graph in FIG. 5. For example, the variations $\Delta n$ in the refractive index corresponding to points (a), (b), (c) and (d) on the voltage curve in FIG. 5 are represented by sawtooth forms indicated in FIGS. 6 through 9, respectively. Therefore, a laser beam 30 passing through the first deflector 24 is deflected at varying angles, e.g., $\theta a$, $\theta b$, $\theta c$ and $\theta d$, as a function of time. The deflection control device 28 is adapted to apply deflection voltages also to the electrodes of the second deflector 26. As a result, the secondary deflection angle $\theta$ of the laser beam 30 which has passed through the first and second deflectors 24 and 26 is almost doubled with respect to the primary deflection angle of the laser beam 30 which has passed through the first deflector 24 only.

Figure 10:
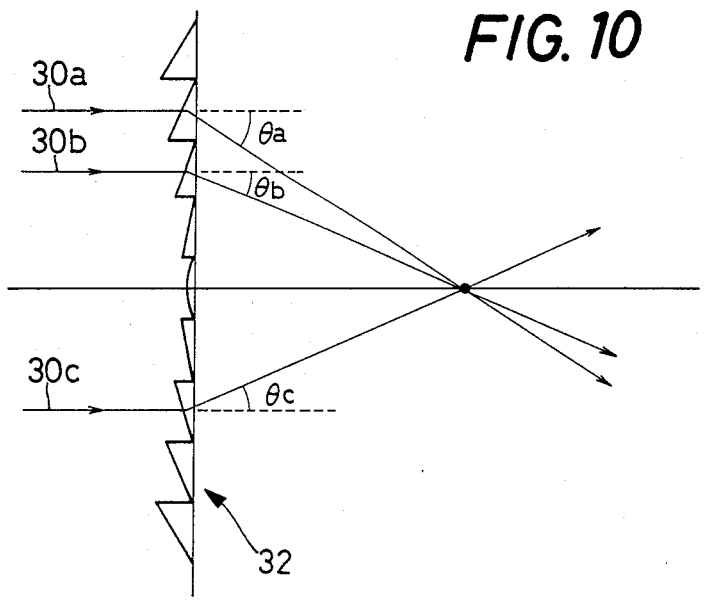
FIG. 10 is a view for explaining the operation of the deflector of FIG. 3.

FIG. 10 schematically shows a Fresnel lens 32, for explaining the operation of the deflector 24 described above. When a comparatively high level of voltage as indicated at (a) in FIG. 5 is applied to the electrodes 24a, 24b of the deflector 24, the laser beam 30 is deflected by the deflector 24 as if the laser beam 30 was incident at a position of the Fresnel lens 32 that is distant from the optical axis, as indicated at 30a. In this case, the laser beam 30a is deflected at an angle $\theta a$. When a comparatively low level of voltage as indicated at (b) in FIG. 5 is applied, the deflection occurs as if a laser beam 30b was incident upon the Fresnel lens 32. Similarly, when the same level of voltage of the reversed polarity is applied, the deflection occurs as if a laser beam 30c was incident. In these cases, the laser beams 30b and 30c are deflected at angles $\theta b$ (positive) and $\theta c$ (negative), as indicated in FIG. 10.

Figure 11:
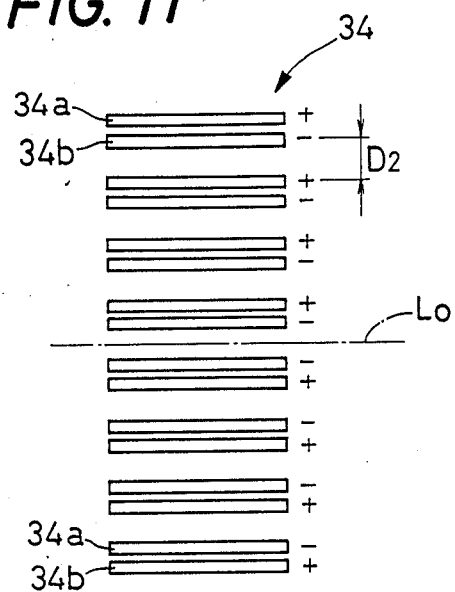
FIG. 11 is a view showing an arrangement of a converging portion of the deflector device of FIGS. 1 and 2.
Figure 12:
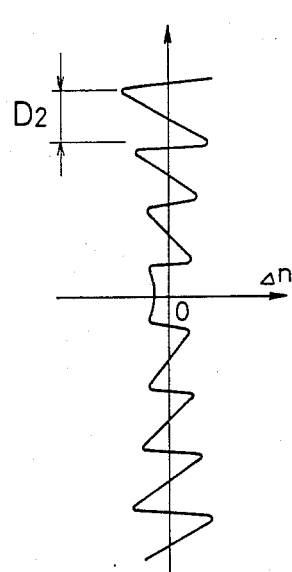
FIG. 12 is a view indicating distributing of refractive index at the converging portion of FIG. 11.

The converging portion 20 is provided to converge the parallel rays of the laser beam 30 which have been deflected by the deflector portion 18, i.e., to concentrate or focus the deflected rays at a specified point. As shown in FIG. 11, the converging portion 20 comprises an electrode array 34 which consists of multiple pairs of convergence electrodes 34a, 34b disposed on the buffer layer 22 on the waveguide 12. Like the pairs of the deflection electrodes 24a, 24b of the deflector 24, the multiple pairs of convergence electrodes 34a, 34b are spaced apart by a suitable distance D2 from each other in the direction perpendicular to the optical axis Lo. In operation, convergence voltages of different levels are applied to the different paris of convergence electrodes 34a, 34b. More specifically, the convergence voltage to be applied to the electrodes 34a, 34b is increased as a function of the distance of the corresponding pair of electrodes 34a, 34b from the optical axis Lo. Further, the polarity of the voltages to be applied to the convergence electrodes 34a, 34b on one side of the optical axis Lo is reversed with respect to the polarity of the voltages to be applied to the convergence electrodes 34a, 34b on the other side of the optical axis Lo. In this arrangement, the distribution of the refractive index, that is, the distribution in variation $\Delta n$ in the refractive index, in the direction perpendicular to the optical axis Lo, is represented by a sawtooth form as shown in FIG. 12, whose saw teeth correspond to the multiple pairs of convergence electrodes 34a, 34b. As illustrated in the figure, the saw teeth corresponding to the electrode pairs on opposite sides of the optical axis Lo have slopes which inclined in opposite directions, and the angle of these slopes is increased as a function of the distance of the pairs of the convergence electrodes 34a, 34b from the optical axis Lo. Therefore, the converging portion 20 which exhibits this refractive index distribution is functionally equivalent to a Fresnel lens having optical properties of a convex lens.

Figure 13:
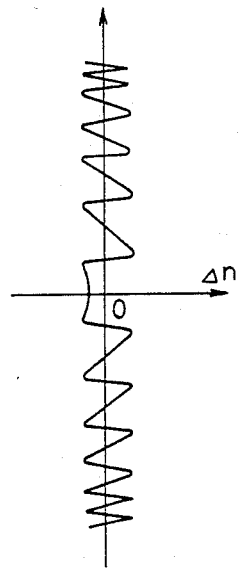
FIG. 13 is a view, corresponding to FIG. 12, showing a modification of the converging portion.

The focal length of the converging portion 20 is adjusted by changing the levels of the convergence voltages to be applied from the deflection control device 28, according to the angle of deflection of the laser beam by the deflector portion 18. The degree of expansion of the width of the laser beam 30 after it has passed through the deflector 18 depends upon the deflection angle $\theta$. Therefore, the above voltage adjustment is effected so that the focal length is lessened as the deflection angle $\theta$ is increased. Although the polarity of the convergence voltages to be applied to the convergence electrodes 34a, 34b is reversed on the opposite sides of the optical axis Lo, the position for reversal of the voltage polarity may be selected as desired, according to the deflection angle of the light. Further, it is possible to obtain the distribution of the variation $\Delta n$ of refractive index as indicated in FIG. 13, by reducing the distance D2 between the electrodes 34a, 34b with an increase in the distance of the electrode pair from the optical axis Lo. In this case, the focal length of the converging portion 20 is reduced as the distance of the electrode pair from the optical axis Lo is increased, even if the voltages to be applied to the electrode pairs constant.

In the deflector device which has been described above, the laser beam 30 introduced from the optical fiber 14 into the waveguide 12 is first processed at the condenser portion 16 so that the laser beam radiation from the end of the optical fiber 14 is rectified into parallel rays parallel to the optical axis Lo. The parallel rays are deflected by the deflector portion 18 at a varying angle. The change in the deflection angle of the rays is achieved through utilization of the electrooptic effect of the electrooptic material of the waveguide 12. More particularly, the angle of deflection is varied by changing the deflection voltage to be applied to the deflectors 24, 26 as a function of time, and thereby changing the distribution of the refractive index of the deflectors 24, 26. The deflected rays of the laser beam 30 which have been deflected by a given angle by the deflector portion 18 are converted at a point on the surface of an object (not shown). Therefore, by changing the angle of deflection of the laser beam 30, the point of convergence of the laser beam 30 is moved on the object surface, whereby the object is scanned over a desired distance, by means of deflection of the light beam over the corresponding angular range.

The instant deflector device does not incorporate mechanical moving parts as used in the conventional deflector device, such as a rotating mechanism for changing the angle of deflection of the light, and a device for driving the rotating mechanism. Hence, the instant deflector device is simplified in construction and improved in durability. Further, the range of deflection angle in the instant device can be changed by adjusting the deflection voltage to be applied to the deflection electrodes of the deflector portion 18. Accordingly, the scanning range by the laser beam can be changed as needed.

Modified embodiments of the present invention will be described. The same reference numerals as used in the preceding figures will be used in the following figures to identify the corresponding elements.

Figure 14:
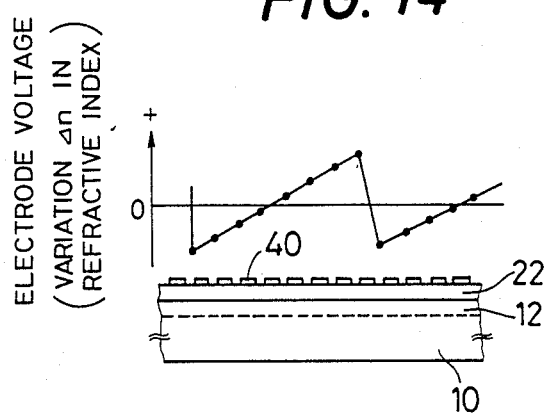
FIG. 14 is a view is illustrating another form of an optical deflector, also showing a variation in deflector voltage and a variation in refractive index of the deflector portion.

In the modified embodiment of FIG. 14, the deflector portion 18 is constituted by a multiplicity of deflection electrodes 40 which are equally spaced apart from each other along the waveguide 12, as indicated in the lower half of the figure. These electrodes 40 are divided into different groups. In this case, different deflection voltages as indicated by a sawtooth form shown in the upper half of the figure are applied to the individual pairs of the deflection electrodes 40 of each electrode group. The distribution of variations $\Delta n$ in the refractive index, corresponding to the positions of the electrode pairs of each group, is represented by the slope of the sawtooth which corresponds to that group. By changing the deflection voltages to be applied to the electrode pairs of each group, the angle of the sawtooth slope may be changed as needed.

Figure 15:
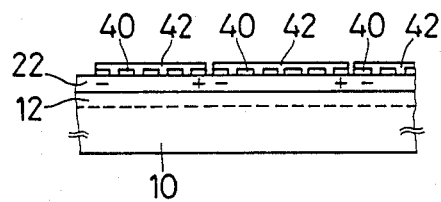
FIGS. 15 and 16 are a fragmentary side elevational view and a perspective view, respectively, showing a further modified form of the deflector.
Figure 16:
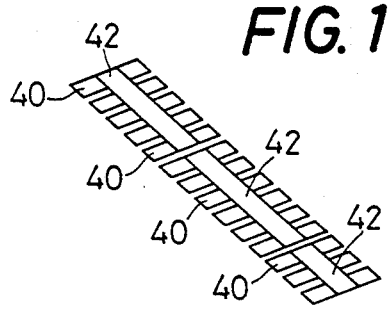

For establishing the desired sawtooth slope, that is, for applying deflection voltages to the individual pairs of the deflection electrodes 40 of each group such that the voltages are varied along the sawtooth slope, it is advantageous to electrically connect the electrode pairs 40 of each electrode group by a resistor 42, as indicated in FIGS. 15 and 16. In this case, a predetermined voltage is applied between the electrode pairs located at the opposite ends of each electrode group. This arrangement simplifies the wiring on the substrate 10.

Figure 17:
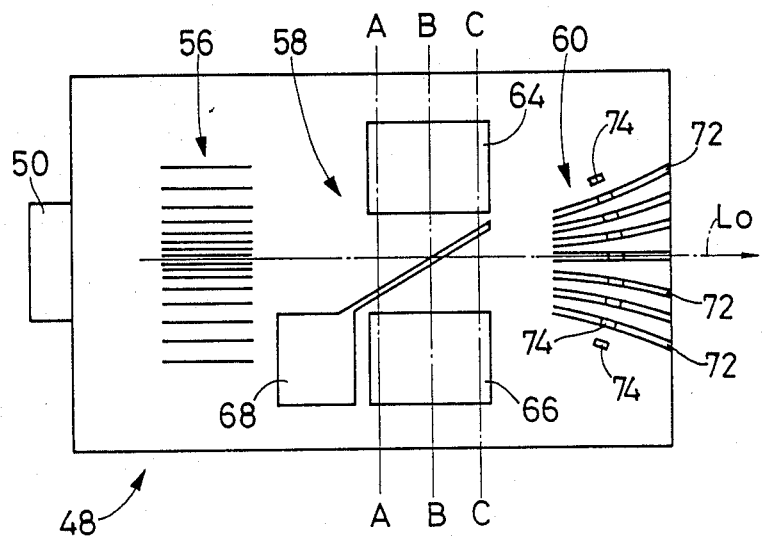
FIGS. 17 and 18 are a plan view and a side elevational view, respectively, of another embodiment of the invention.
Figure 18:
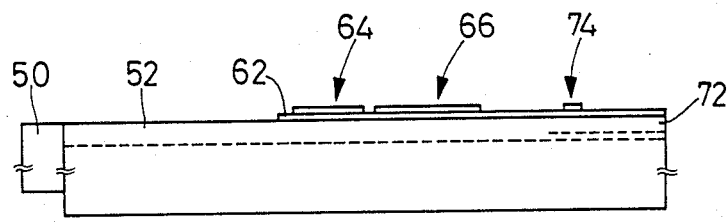

The deflector portion 18 of FIG. 1 for deflecting the laser beam may be replaced by a deflector portion 58 as shown in FIG. 17. This deflector portion 58 is provided on a rectangular substrate 10 of a deflector element generally indicated at 48 in the figure. The substrate 10 of the deflector element 48 is an electrooptic layer which has a thickness of about 0.5 mm and which is made of a suitable electrooptic material such as crystals of $LiNbO_3$. As shown in FIG. 18, a waveguide 52 is formed adjacent to one of opposite surfaces of the substrate 10. As previously described, the waveguide 52 is provided in the form of a thin layer that has a higher refractive index than the electrooptic material of the substrate 10. The higher refractive index of this thin layer causes the waves of a light beam to be trapped in the direction of thickness of the waveguide 52, whereby the waves of the light beam are properly guided or conducted through the waveguide 52. For example, the layer of the waveguide 12 is formed, with a comparatively small thickness of several microns, by diffusion of a suitable material such as Ti (titanium) through the skin portion of the substrate 10. The substrate 10 and the layer of the waveguide 52 are integral parts of each other, and the refractive index is varied continuously across the interface or boundary of the substrate 10 and the waveguide layer. The boundary is indicated in broken line is FIG. 18.

A semiconductor laser element 50 is attached to one end of the substrate 10 of the deflector element 48 such that the laser element 50 is coupled to the corresponding end of the waveguide 52, to introduce a laser beam into the waveguide 52. The laser radiation from the end of the laser element 50 is condensed into parallel rays while passing through a condenser portion 56 formed in the waveguide 52, near the laser element 50. The parallel rays are then passed through the deflector portion 58, so that the rays are deflected, as described later in detail. The thus deflected parallel rays are then converged by the converging portion 60, i.e., focused at a desired point on an object distant from the converging portion 60.

Described more specifically, the condenser portion 56 is formed parallel to the surface of the substrate 10, so as to extend perpendicularly to an optical axis Lo of the laser beam, by means of diffusion of a suitable material such as titanium, such that the diffusion density or the concentration of the diffused material is increased in opposite directions toward the optical axis Lo. In other words, the refractive index of the condenser portion 56 in the waveguide 12 is increased in the directions toward the optical axis Lo. The thus formed condenser portion 56 functions as a convex lens. Successive straight lines indicated at 56 in FIG. 17 represent the condenser portion 56. The density of the straight lines represents the distribution of the refractive index. While the condenser portion 56 is formed as described above, it may be replaced by other mean such as a geodesic lens provided in the form of a concave cavity formed in the surface of the waveguide 12.

The deflector portion 58 and the converging portion 60 are formed on a buffer layer 62 formed on the waveguide 52. The buffer layer 62 is a layer of several microns which is made of a transparent material such as $SiO_2$ having a lower refractive index than the material of the waveguide 62. The buffer layer 52 is provided for preventin electrodes (which will be described) of the deflector and converging portions 58, 60 from absorbing the energy of the laser light passing through the waveguide 12. However, the buffer layer 62 may be eliminated.

The deflector portion 58, which is provided to deflect the laser beam at varying angles, comprises a pair of deflection electrodes 64, 66, and another deflection electrode 68. The electrodes 64 and 66 are disposed in parallel on both sides of the optical axis Lo such that the electrodes 64, 66 are spaced a suitable distance from the optical axis Lo. The third deflection electrode 68 has an extension which obliquely extends between the first and second deflection electrodes 64, 66 so as to intersect the optical axis Lo, a shown in FIG. 17.

Where the substate of the deflector element 48 is made of $LiNbO_3$ (Y-cut crystal), the previously indicated formula (1) represents the variation $\Delta n$ in refractive index at the portion of the waveguide 52 located between the deflection electrodes 64, 66 in the direction perpendicular to the optical axis Lo. Namely, the distribution of the refractive index, i.e., the distribution of the refractive index variation $\Delta n$ in the above direction is changed with the distribution of a magnitude of an electric field E produced at the portion between the two electrodes 64, 66. For example, when a positive voltage is applied to the electrode 68, while an earth voltage is applied between the pair of electrodes 64, 66, the electric field E and the refractive index variation $\Delta n$ at positions A—A, B—B and C—C of the deflector portion 58 have the distributions as indicated by graphs of FIGS. 19, 20 and 21, respectively. In this condition, therefore, the rays of laser light transmitted parallel to the optical axis Lo are subject to different average refractive indexes while passing through the deflector portion 58. Namely, the rays passing nearest to the electrodes 64 and 66 experience, for example, the lowest and highest refractive indexes, respectively. Thus, the stream of the laser rays is deflected on one side of the optical axis Lo which is higher in refractive index than the other side.

In the arrangement indicated above, the deflection voltages to be applied to the electrode 68 and to the electrodes 64, 66 are varied as a function of time, for example, following a sine curve. As a result, the angle of deflection $\theta$ of the laser beam by the deflector portion 58 is accordingly varied in synchronization with the variation in the deflection voltages applied to the deflection electrodes 64, 66, 68. In connection with the graphical representations in FIGS. 19-21, it is noted that the positions along lines A—A, B—B and C—C are viewed in the direction from the converging portion 60 toward the condenser portion 56, and that the positive side of the electric field E corresponds to the lower side of the optical axis Lo as seen in FIG. 17.

The converging portion 60 comprises a radial array of multiple three-dimensional wave guides 72 which are disposed radially so that a laser beam 70 of a given angle of deflection with respect to the optical axis Lo may be transmitted through the appropriate waveguides 72. In other words, the waveguides 72 are disposed so as to cover a predetermined angular range over which the laser beam is deflected by the deflector portion 58. The converging portion 60 further comprises multiple convergence electrodes 74 which consist of the electrodes aligned with the respective waveguides 72, and the electrodes which are located outside of the radial array of the waveguides 72 and near the outermost electrodes aligned with the outermost waveguides 72. While only seven waveguides 72 are shown in FIG. 17 for easy understanding, the waveguides 72 are actually provided in a large number.

Figure 22:
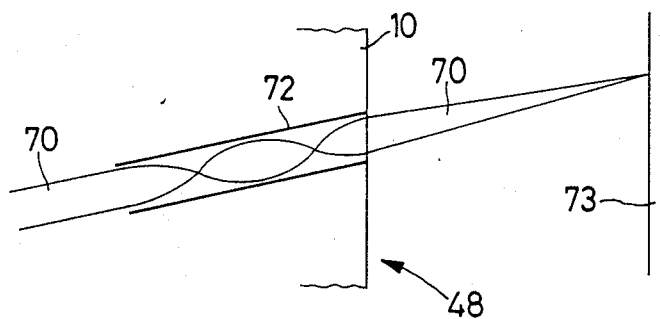
FIG. 22 is an illustration indicating propagation of a laser beam through a converging portion of the embodiment of FIG. 17.
Figure 23:
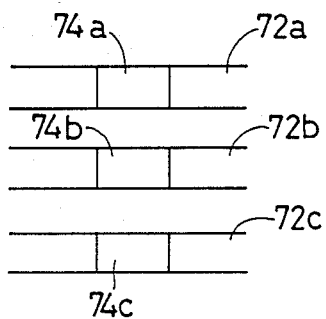
FIG. 23 is a view for explaining the operation of electrodes of the converging portion.
Figure 24:
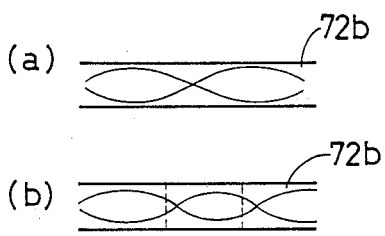
FIG. 24 is a view for explaining the operation of the converging portion, indicating at (a) and (b) the states in which a voltage is applied and not applied to the electrodes, respectively.
Figure 25:
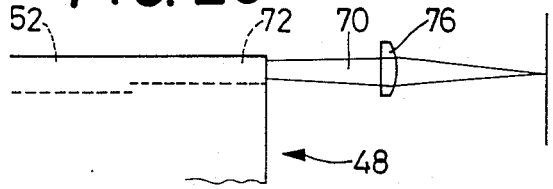
FIG. 25 shows an example of a toroidal lens disposed on the output side of the deflector element of FIG. 17.

The three-dimensional waveguides 72 are formed by diffusion of a suitable material such as titanium, such that the refractive index of the converging portion 60 is increased toward the optical axis Lo, toward the center of the radial array. The laser beams 70 transmitted through the appropriate waveguides 72 are converted at different points on a surface 73 (FIG. 22) of the object, which points on the surface 73 are shifted along a line according to a change in the angle of deflection of the light by the deflector portion 58. In order to converge the laser rays 70 from each waveguide 72 on the surface 73, a convergence voltage is applied between the appropriate convergence electrodes 74. For example, when the laser rays 70 from the waveguide 72b is converged on the surface 73, a convergence voltage is applied between the convergence electrodes 72a and 72c which are adjacent to the convergence electrode 72b which is aligned with the waveguide 72b. As a result, the refractive index at the portion of the waveguide 72b which is located between the electrodes 72a and 72c is varied, whereby the laser rays 70 are changed from the state of (a) in FIG. 24 to the state of (b) in the same figure. In this manner, the rays of the laser light from the waveguide 72b are focused or concentrated at a point on the surface 73. To achieve this compensation or adjustment of the focal length of the individual waveguides 72, a suitable convergence control circuit (not shown) is provided to cyclically supply voltage signals to the appropriate pairs of the convergence electrodes 74. The voltage signals are determined depending upon the specific angles of deflection of the light obtained by the deflector portion 58. As illustrated in FIG. 25, it is possible to use a toroidal lens 76 for accomplishing vertical focusing of the laser rays 70 from the converging portion 60.

In the deflector element 48 of FIG. 17 constructed as described above, the rays of the laser light from the condenser portion 56 are deflected by the deflector portion 58, by utilizing the electrooptic effect of the electrooptic material which forms the waveguide 52. Further, the angle of deflection of the light by the deflector portion 58 is changed by changing the deflection voltages to be applied to the deflection electrodes 64, 66, 68, as a function of time, so as to vary the distribution of the refractive index in the direction perpendicular to the optical axis Lo. Hence, the instant deflector element 48 does not include any mechanical moving parts, such as a rotary unit and a drive for operating the rotary unit as used in the conventional apparatus. Accordingly, the instant deflector device in the form of the deflector elment 48 is improved in terms of operating noise, operating reliability and durability.

While the present invention has been described in its preferred forms referring to FIGS. 1–25, the invention may be embodied in other forms.

For example, the deflection control device 28 used in the first embodiment may be modified to apply to the deflector portion 18 a DC voltage whose amplitude is varied without a reversal of its polarity, rather than an alternating current as indicated in the upper part of FIG. 5. Further, the arrangement of the electrodes of the deflector portion 18, and the manner of applying a deflection voltage to the electrodes, may be modified as desired, provided the distribution of the refractive index at the deflector portion 18 is inclined in one direction and provided the distribution is changed by controlling the deflection voltages.

While the deflector portion 18 of FIG. 1 uses the two deflectors 24, 26 for deflecting the light from the condenser portion 16, the deflector portion 18 may have a single deflector or three or more deflectors.

In the embodiment of FIG. 1, the deflection electrodes 24a, 24b of the deflector portion 18 are spaced from each other in the direction perpendicular to the optical axis Lo; the array of the electrodes 24a, 24b may extend in other directions, provided the electrode array intersects the optical axis Lo.

As previously described, the waveguide 12 on the substrate 10 of the first embodiment is formed by diffusion of titanium (Ti) through the substrate 10 which is made of a crystal of $LiNbO_3$. However, a similar waveguide may be formed as a thin layer of an electrooptic material such as $LiNbO_3$ that is formed on other substrates, e.g., on a substrate made of $LiTaO_3$ or $SiO_2$ which demonstrates a very low electrooptic effect. Further, such a thin layer formed by diffusion for the waveguide 12 may be made of other metallic materials such as vanadium (V), niobium (Nb) and copper (Cu).

Still further modified embodiments of the invention will be described referring to FIGS. 26–33.

Figure 26:
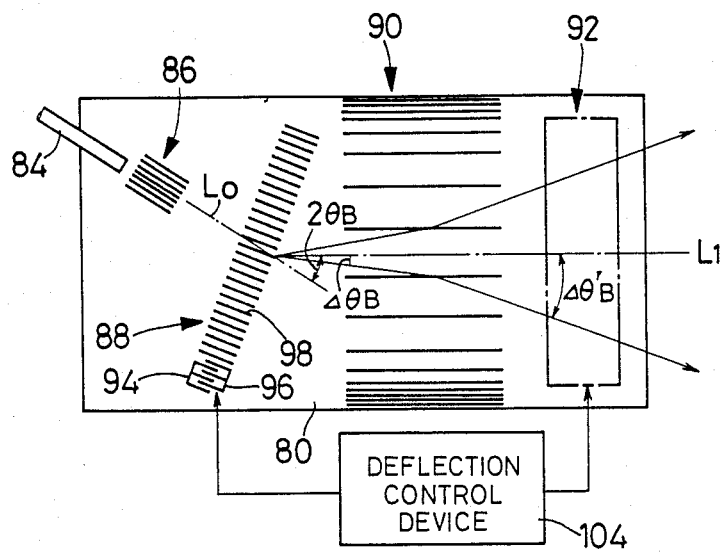
FIGS. 26 and 27 are a plan and a side elevational view, respectively, of a further embodiment of an optical deflector device of the present invention.
Figure 27:
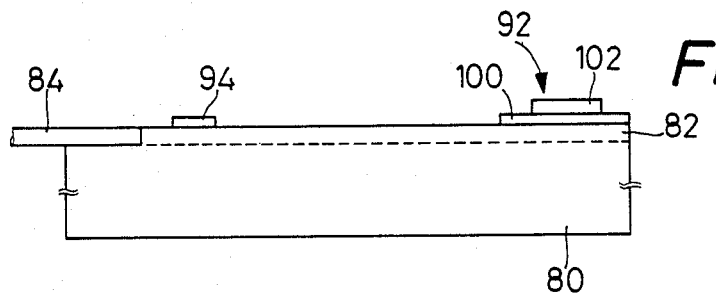

In FIGS. 26 and 27, reference numeral 80 designates a rectangular substrate which has a thickness of about 0.5 mm and is made of an electrooptic material such as a crystal of $LiNbO_3$. On one surface of the substrate 80, a thin layer of titanium is formed to provide a waveguide 82 similar to the waveguides 12 and 52 previously described. As a light source, an optical fiber 84 is coupled to one end of the waveguide 84. The laser rays radiated from the end of the optical fiber 84 are condensed into parallel rays by a condenser portion 86, and deflected by a deflector portion 88. The deflected laser rays are further deflected by a deflection-amplifying portion 90, before they are converged by a converging portion 92.

Figure 28:
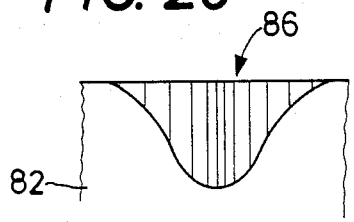
FIGS. 28 and 29 are fragmentary views illustrating arrangements of a condenser portion and a converging portion, respectively, of the deflector device of FIGS. 26 and 27.

Like the condenser portion 16, 56 of FIGS. 1 and 17, the condenser portion 86 of the present embodiment is formed by diffusion of a suitable material such as titanium, such that the diffusion density or the concentration of the diffused material is increased in opposite directions toward the optical axis Lo. In other words, the refractive index of the condenser portion 86 in the waveguide 82 is increased in the direction toward the optical axis Lo, as indicated in FIG. 28. The thus formed condenser portion 86 functions as a convex lens. While the variation in the refractive index of the condenser portion 86 is actually not perceived, the vertical parallel lines are given in FIG. 26 for indicating the distribution of the refractive index.

The deflector portion 88 comprises a single deflector which uses a pair of comb-like deflection electrodes 94, 96. Upon exitation of the electrodes 94, 96, elastic surface waves 98 (ultrasonic waves) are generated from the electrodes 94, 96, whereby the refractive index of the deflector portion 88 in the waveguide 82 is periodically varied in the direction intersecting the optical axis Lo. When a laser beam is passed through the ultrasonic field, the laser beam is diffracted due to Bragg diffraction. More particularly stated, an angle of diffraction 2 $\theta_B$ of the laser beam due to the Bragg diffraction is obtained from the following formula (2):

$$2\theta_B = \lambda/n\Lambda \tag{2}$$

where,
λ: wavelength of laser beam;
n: refractive index in waveguide 82;
Λ: wavelength of elastic surface waves.

When a frequency of a voltage to be applied from a deflection control device 104 to the comb-like electrodes 94, 96 is changed by Δf, an angle of deflection of the laser beam is changed by $\Delta\theta_B$ which is obtained from the following formula (3):

$$\Delta\theta_B \approx \lambda \cdot \Delta f/v \tag{3}$$

where, v: propagation velocity of elastic surface waves. Although the elastic surface waves 98 are actually invisible, they are indicated in FIG. 26 for easy understanding. In the present embodiment wherein the substrate 80 is made of LiNbO₃, that is a piezo-electric element, the elastic surface waves 98 are produced when a deflection voltage is applied to the comb-like electrodes 94 96. However, the comb-like electrodes 94, 96 may be replaced by a PZT, ZnO or other ultrasonic transducer or oscillator disposed at the edge of the substrate 80. In this sense, a portion of the substrate 80 located between the comb-like electrodes 94, 96 constitutes an ultrasonic transducer.

Figure 29:
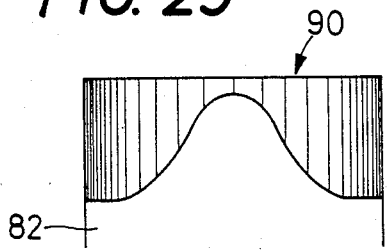

The deflection-amplifying portion 90 is formed by diffusion of a suitable material such as titanium (Ti) through the substrate 80, such that the diffusion density or the concentration of the diffused material is increased in opposite directions away from an axis L1 which is aligned with a center of the angular range within which the laser beam is deflected by the deflector portion 88. In this arrangement, the refractive index of the deflection-amplifying portion 90 in the waveguide 82 is increased in the directions away from the axis L1, as indicated in FIG. 29. Therefore, the deflection-amplifying portion 90 serves as a concave lens. Consequently, the deflection angle $\Delta\theta_B$ at the deflector portion 88 is amplified to $\Delta\theta_B'$ by the deflection-amplifying portion 90. In connection with FIG. 29, the vertical parallel lines are provided merely for indicating the distribution of the refractive index of the deflection-amplifying portion 90.

The converging portion 92 uses multiple pairs of convergence electrodes 102 which are disposed on a buffer layer 100 on the waveguide 82, so that the electrodes 102 cooperate to function as a convex lens. The buffer layer 100 is a layer of several microns which is made of a transparent material such as SiO₂ having a lower refractive index than the material of the waveguide 82. The buffer layer 100 is provided for preventing the electrodes 102 from absorbing the energy of the light passing through the waveguide 82. However, the layer 100 may be eliminated.

Figure 30:
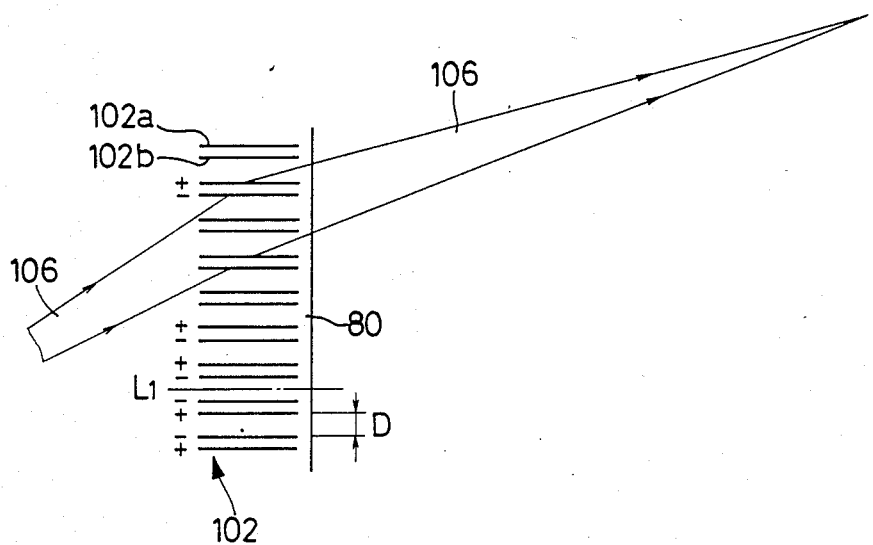
FIG. 30 is an illustration showing the arrangement of the converging portion of FIG. 26.

As illustrated in detail in FIG. 30, an array of the convergence electrodes 102 of the converging portion 92 consists of multiple pairs of electrodes 102a, 102b which are equally spaced apart by a suitable distance D from each other in the direction perpendicular to the optical axis L1. In operation, convergence voltages of different levels are applied to the different pairs of convergence electrodes 102a, 102b. More specifically, the convergence voltage to be fed from a deflection control device 104 to the electrodes 102a, 102b is increased as a function of the distance of the corresponding electrode pair 102 from the optical axis L1. Further, the polarity of the convergence voltages to be applied to the electrode pairs on one side of the optical axis Lo is reversed with respect to the polarity of the convergence voltages to be applied to the electrode pairs on the other side of the optical axis Lo. However, it is possible that the distance D between the adjacent electrode pairs can be reduced as the distance of the electrode pairs from the axis L1 is increased. In this case, the voltages of the same level are applied to all of the electrode pairs 102a, 102b.

Figure 31:
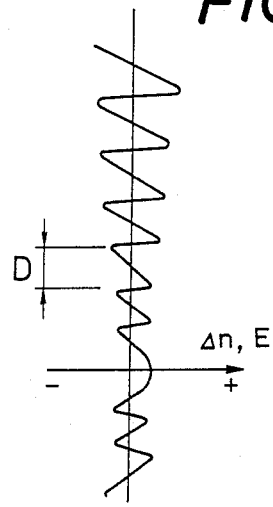
FIG. 31 is a graphical representation indicating a variation in electric field (a variation in refractive index of the converging portion) at the converging portion of FIG. 30.

In the arrangement of the convergence electrodes 102 of FIG. 30 of the converging portion 92, the distribution of an electric field E produced in the direction perpendicular to the axis L1 is represented by a sawtooth form as indicated in FIG. 31, whose saw teeth correspond to the multiple pairs of electrodes 102a, 102b. As shown in the figure, the saw teeth corresponding to the electrode pairs on opposite sides of the optical axis L1 have slopes which are inclined in opposite directions. In general, an electrooptic material has an optical property that its refractive index is varied with a magnitude of an electric field to which the material is exposed. For instance, where the substrate 80 is made of LiNbO₃, the variation Δn in the refractive index at the portions between the electrode pairs 102 is expressed by the formula (1) previously given. Accordingly, the distribution of the refractive index, i.e., the distribution of the variation Δn in the refractive index in the direction perpendicular to the optical axis L1, is also represented by the sawtooth form of FIG. 31, which represents the distribution of the magnitude of the electric field E. Hence, the converging portion 92 serves as a convex lens capable of converging light rays, when the congergence voltages are applied to the convergence electrode pairs as previously described. More specifically, the angle of inclination of the slopes of the sawtooth form representative of the distribution of the refractive index to be established by the electrodes 102 can be varied as a function of time, by changing the convergence voltages which are applied from the deflection control device 104 to the respective convergence electrode pairs 102a, 102b at the different positions with respect to the optical axis L1. This change in the voltages to be applied to the electrode pairs 102a, 102b is effected in timed relation with the frequency of the voltage signals to be supplied to the deflector portion 88. As a result, the distribution of the refractive index of the converging portion 92 is varied, whereby the focal point of the laser beam emitted from the converging portion 92 can be adjusted according to the angle of deflection of the light at the deflector portion 88. Namely, the deflection control device 104 is designed so that the convergence voltages to be applied to the electrode pairs 102a, 102b are increased with an increase in the angle of deflection of a laser beam 106 (FIG. 32) at the deflector portion 88, because the degree of expansion of the width of the laser beam 106 during its propagation from the deflector portion 88 to the converging portion 92 is increased as the angle of deflection at the deflector portion 88 is increased.

Figure 32:
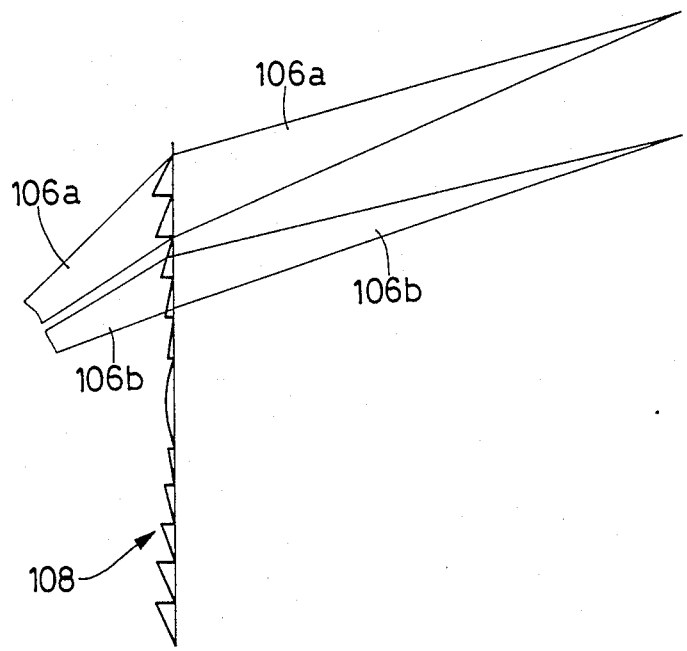
FIG. 32 is an illustration of explaining the operation of the converging portion of FIG. 30.

The converging portion 92 is considered to be a convex lens functionally equivalent to a Fesnel lens, because of its refractive index distribution represented by a sawtooth form whose slopes are inclined in opposite directions with respect to the optical axis L1. The converging portion 92 establishes the refractive index distribution by means of distribution of the magnitude of the electric field E. On the other hand, the Fresnel lens establishes the refractive index distribution by means of distribution of the angle of the stepped setbacks. In this sense, the operation of the converging portion 92 will be described more specifically referring to FIG. 32 which schematically shows a Fresnel lens 108. As indicated in the figure, the laser beam 106a which has been deflected by the deflector portion 88 by a comparatively large angle $\Delta\theta_B$ is incident upon the Fresnel lens 108 at its radially outer portion at which the angle of slopes of the setbacks is comparatively large. As a result, the laser beam 106a is refracted by a comparatively large angle by the Fresnel lens 108. In the meantime, the laser beam 106b whose deflection angle $\Delta\theta_B$ at the deflector portion 88 is comparatively small is incident upon a comparatively inner portion of the Fresnel lens 108 at which the angle of slopes of the setbacks is comparatively small. In this case, therefore, the angle of refraction of the laser beam 106b by the Fresnel lens 108 is comparatively small, as indicated in FIG. 32. Actually, the above-indicated angles of the stepped setbacks of the Fresnel lens 108 are established by the deflection control device 104, that is, by changing the convergence voltages which are applied to the convergence electrodes 102a, 102b of the converging portion 92. In this manner, the focal length of the Fresnel lens 108 (converging portion 92) may be changed according to the angle of deflection of the laser beam 106 at the deflector portion 88.

According to the deflector device arranged as described above, the laser beam 106 radiated from the optical fiber 84 and introduced into the waveguide 82 is condensed into parallel rays by the condenser portion 86, and is deflected by a total angle of $\Delta\theta_B'$ by the deflector portion 88 and the deflection-amplifying portion 90. This total deflection angle is determined by the frequency of the voltage signals which are fed from the deflection control device 104 to the comb-like electrodes 94, 96 as previously described. The focal point of the thus deflected laser beam 106 is adjusted by the converging portion 92 so that the laser beam 106 is focused on a specified point on the surface of an object (not shown). In other words, the laser beam 106 is focused on the object surface, irrespective of its angle of deflection by the deflector portion 88. In this arrangement, the laser beam spot is moved on the object surface by changing the deflection angle of the laser beam 106 by the deflector portion 88, whereby a scanning is possible within a predetermined angular range.

Like the preceding embodiments, the present embodiment of the deflector device does not incorporate any mechanical moving parts as used in the conventional counterpart. The instant deflector device in its entirety is provided in the form of a single, compact, integral body which comprises the condenser portion 86, deflector portion 88, deflection-amplifying portion 90 and converging portion 92. Thus, the device is improved in operating reliability and durability. As a further advantage, the angular range of deflection of the laser beam, i.e., the range of scanning on the object surface, can be readily determined and changed by controlling the frequency of the voltages to be applied to the comb-like electrodes 94, 96 of the deflector portion 88.

Although the optical fiber 84 is coupled at one end of the substrate 80, it is possible to use a semiconductor laser chip as a light source. In this instance, the laser chip is attached to one of the major surfaces or an end face of the substrate 80.

The waveguide 82 on the substrate 80 is formed by diffusion of titanium (Ti) on one surface of the substrate 80 which is made of a crystal of LiNbO$_3$. However, a similar waveguide may be formed on a substrate of other materials such as LiTaO$_3$ or SiO$_2$ which demonstrates a very low or no electrooptic effect. Further, such a thin layer formed by diffusion for the waveguide 82 may be made of other metallic materials such as vanadium (V), niobium (Nb) and copper (Cu).

Further, the condenser portion 86 may be replaced by other condensing means such as a geodesic lens or Fresnel lens provided in the form of a concave cavity formed in the surface of the waveguide 82.

Figure 19:
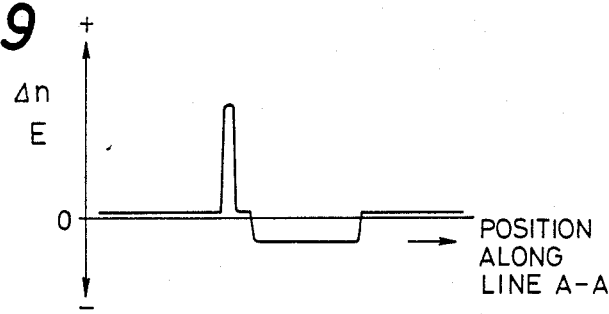
FIGS. 19, 20 and 21 are graphical representations showing distributions of electric field (variation in refractive index of a deflector portion), taken along lines A—A, B—B and C—C, respectively.
Figure 20:
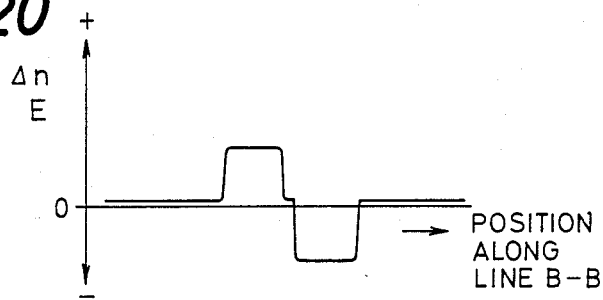
Figure 21:
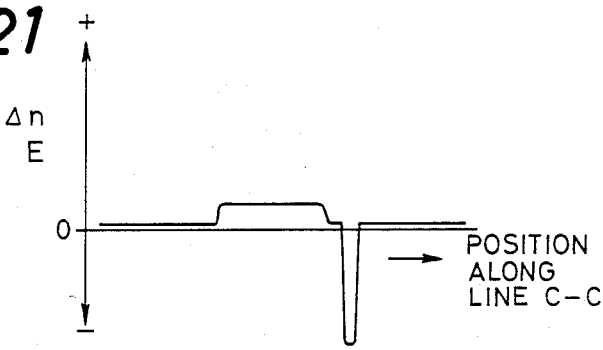
Figure 33:
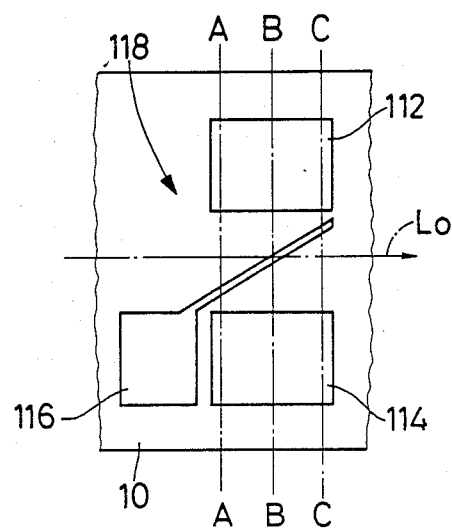
FIG. 33 is an enlarged fragmentary plan view of a deflector portion which is used in place of the deflector portion used in the embodiments of FIGS. 26 and 27.

Although the embodiment of FIG. 26 uses the deflector portion 88 as described, it is possible to replace this deflector portion 88 by a deflector portion 118 as indicated in FIG. 33. Like the deflector portion 58 of FIG. 17, the deflector portion 118 comprises a pair of electrodes 112, 114 on both sides of the optical axis Lo, and another electrode 116 which has an extension extending obliquely between the electrodes 112, 114, so as to intersect the optical axis Lo. As previously described, the deflection of light by the deflector portion 118 utilizes the electrooptic effect of an electrooptic material of a waveguide formed below the electrodes 112, 114, 116. That is, the refractive index at the portion of the deflector portion 118 (waveguide) between the electrodes 112, 114 is varied as a function of the magnitude of an electric field produced by application of deflection voltages to the electrodes 112, 114, 116. The graphs in FIGS. 19, 20 and 21 represent the distributions of the electric field E and the distributions of variation $\Delta n$ in the refractive index along the lines A—A, B—B and C—C of FIG. 33, respectively. The parallel laser light rays passing along the optical axis Lo are subject to different average refractive indexes during propagation through the deflector portion 118, whereby the stream of the laser rays is deflected in a direction corresponding to the variation $\Delta n$ in the refractive index. This direction of deflection, or the angle of deflection, can be changed by changing the deflection voltages applied to the deflection electrodes 112, 114, 116, as a function of time.

Further, the deflector portion 88 may be replaced by an arrangement for Raman-Nath diffraction, which is adapted to absorb rays which are diffracted in directions other than a selected direction, that is, adapted to permit the passage of only the rays which are diffracted in the selected direction.

While the deflector portion 88 uses a single deflector comprising the comb-like electrodes 94, 96, it is possible to use two or more deflectors as necessary, which are disposed in series along the waveguide 82.

Further, the deflection-amplifying portion 90 may comprise a multiplicity of electrode pairs as used in the converging portion 90. In this instance, voltages of the polarities opposite to those of the converging portion 90 are applied to the electrode pairs on opposite sides of the optical axis L1 such that the voltages are increased with an increase in the distance of the electrode pairs from the optical axis L1, in order to establish the distribution of refractive index similar to that of a concave lens. In other words, the refractive index distribution established by the electric field distribution due to the electrooptic effect is represented by a sawtooth form whose slopes are inclined in the opposite directions on the opposite sides of the optical axis L1, the angle of inclination of the sawtooth slopes being increased in the directions away from the optical axis L1. In this case, the degree of amplification of the deflection angle can be changed by adjusting the levels of the deflection voltages to be applied to the deflection electrodes.

Referring to FIGS. 34–42, there will be described methods for forming a waveguide on a substrate used for a deflector device according to the invention.

Figure 34:
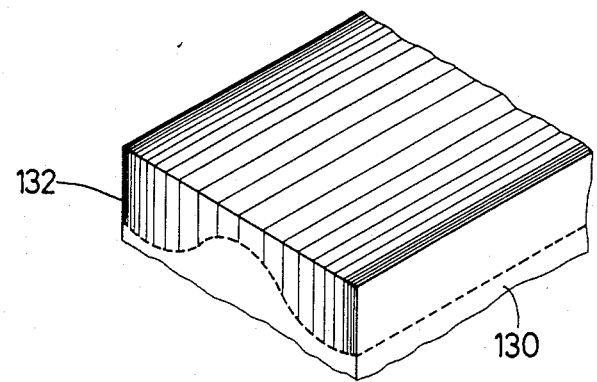
FIGS. 34 and 35 are a perspective view and a plan view, respectively, illustrating a waveguide in another embodiment of the invention.
Figure 35:
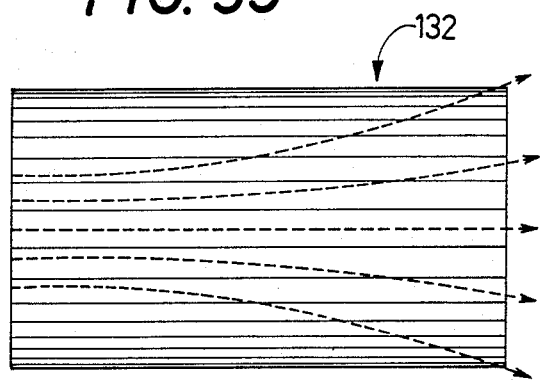

There is partly shown in FIGS. 34 and 35 a substrate 130 which has a waveguide 132. The substrate 130 is a layer of about 5 mm thickness which is made of a suitable electrooptic material such as a crystal of LiNbO$_3$. The waveguide 132, which functions as a concave lens, is constituted by a layer which generally has a thickness of several microns and which is formed on one of opposite major surfaces of the substrate 130. This layer for the waveguide 132 has a higher refractive index than the other portion of the substrate 130, whereby the waveguide 132 is given a characteristic which permits a beam of light to be guided and conducted therethrough while the light beam is trapped in the direction of thickness of the waveguide 132. The waveguide 132 is prepared so that its refractive index increases in opposite directions away from the centerline of the waveguide 132 (optical axis of the light beam), along the width of the substrate 130 (across the length of the waveguide 132), and in a plane parallel to the surface of the substrate 130. The waveguide 132 thus constructed performs a function of a concave lens, serving to scatter the light rays while they pass through the waveguide 132, as indicated in broken line in FIG. 35. In FIGS. 34 and 35, the distribution of the refractive index of the waveguide 132 in its transverse direction is indicated by the density of straight lines parallel to the length of the waveguide 132.

Figure 36:
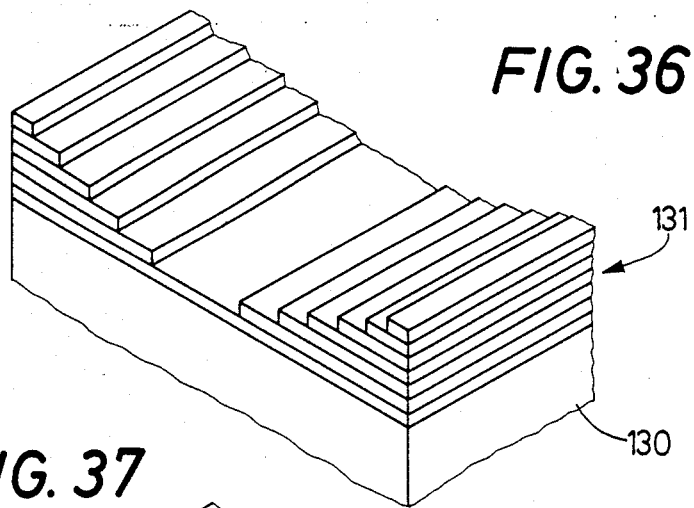
FIG. 36 is a perspective view showing a method of forming the waveguide of FIGS. 34 and 35.

The waveguide 132 is prepared in the following process:

Initially, one of the opposite major surfaces of the substrate 130 is covered with a thin layer of a suitable diffusion material 131 such as titanium (Ti) which is formed by a vapor deposition process. The vapor deposition process is repeated to form a pair of stepped setbacks of the same diffusion material 131 on the initially formed layer, such that the setbacks are symmetrical with each other with respect to the centerline of the substrate 130, i.e., to the optical axis, and such that the number of layers of the stepped setbacks increases in the directions away from the optical axis, as illustrated in FIG. 36.

Subsequently, the substrate 130 with the setbacks of the material 131 formed thereon is held at an elevated temperature of about 1000° C. for a few or several hours. As a result, the particles of the diffusion material 131 are thermally diffused through the electrooptic material adjacent to the surface of the substrate 130, whereby the waveguide 132 as shown in FIGS. 34 and 35 is formed on the surface of the substrate 130.

In the thus prepared waveguide 132, the density of the diffused particles of the material 131 is considerably low in the central portion as viewed in the direction of width of the waveguide 132 (across its length). The density gradually increases in the directions away from the central portion. In the case where the difusion material 131 is titanium, the refractive index increases with an increase in the density of the diffused particles. Accordingly, the refractive index of the waveguide 132 increases in the directions away from its centerline. Therefore, the waveguide 132 is capable of serving as a concave lens.

Figure 37:
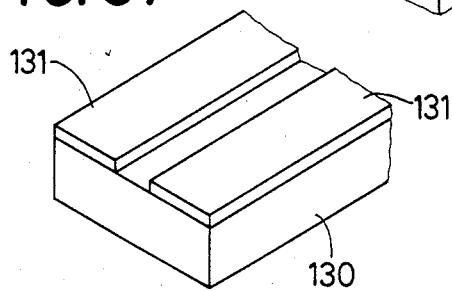
FIGS. 37 and 38 are perspective views, corresponding to FIG. 36, showing modified embodiments of the method of the invention.
Figure 38:
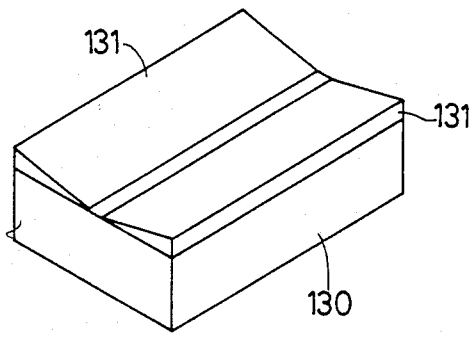

The above-indicated distribution of the density of the diffused particles of the diffusion material 131 may also be obtained by depositing a pair of rectangular layers of the material 131 along the opposite sides of the substrate 130 such that the central portion of the substrate 130 is left uncovered by the layers of the diffusion material 131, as indicated in FIG. 37. Alternatively, the material 131 may be deposited on the substrate 130 such that the thickness of the material 131 continuously increases in the directions away from the centerline of the substrate 130 as indicated in FIG. 38. The above-indicated process for giving the intended distribution of refractive index of the waveguide 132 may be applied to the substrate 130 which has already been provided with a preliminary waveguide that has constant refractive index over its entire surface. Further, the waveguide 132 which has been formed by a diffusion process with the desired refractive index distribution may be subsequently subjected to another diffusion process at its entire area for the purpose of increasing the overall refractive index of the waveguide 132.

Further, the diffusion material 131 may be selected so that the intended refractive index distribution may be established by reducing the refractive index of the substrate 130 by the diffusion of the material 131. In this case, the material 131 should be deposited on the substrate 130 such that its thickness increases in the directions toward the centerline of the substrate 130, contrary to the cases of FIGS. 36–38. since the diffusion of the material 131 reduces the refractive index of the substrate 130, the portion of the substrate 130 corresponding to the waveguide 132 to be formed should be given a sufficiently high refractive index before the material 131 is diffused through the substrate 132, in order to prevent the refractive index of the waveguide 132 from being reduced below the refractive index of the remainder of the substrate 130.

Figure 39:
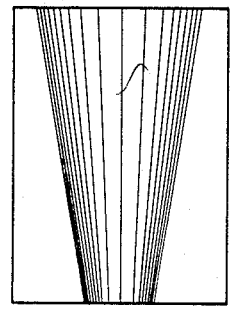
FIGS. 39 and 40 are plan views of yet further embodiments of the invention.
Figure 40:
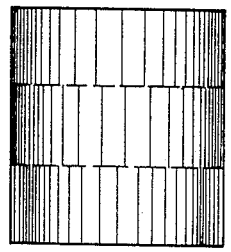

It is possible to effect the diffusion of the material 131 so that the area of the substrate 130 to be subjected to the diffusion is expanded in the direction of propagation of the light, as indicated in FIG. 39. It is also possible to apply the material 131 so that distinct successive areas of the substrate 130 in the direction of propagation of the light have different distributions of density of the diffusion material 131, as indicated in FIG. 40, in order to provide a pluralty of concave lenses having different scattering characteristics.

Figure 41:
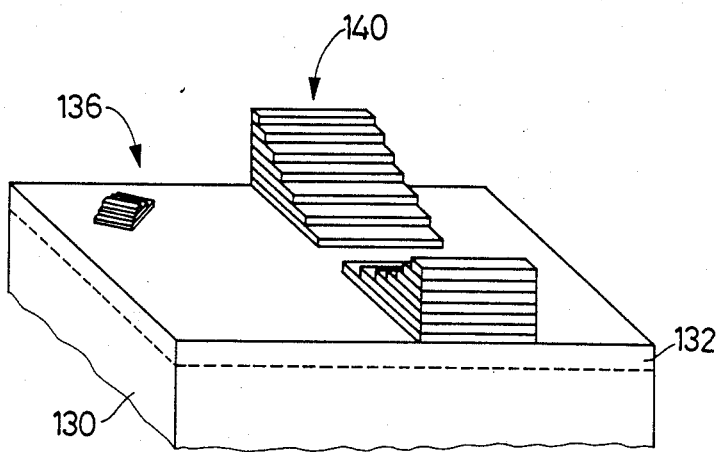
FIGS. 41 and 42 are a perspective view and a plan view, respectively, showing another embodiment of the method of the invention.
Figure 42:
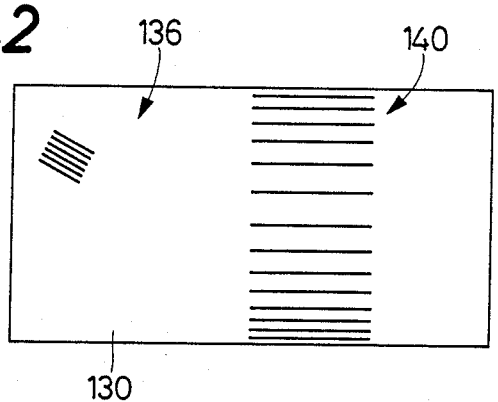

The above-described diffusion process for giving the waveguide 132 a concave-lens function may be adapted to establish a distribution of refractive index of a convex lens. In an example of FIG. 41, the diffusion material 131 is deposited at two locations on the substrate 130, in order to form a condenser portion 136 (functionally equivalent to a convex lens) and a deflection-amplifying portion 140 (functionally equivalent to a concave lens). For the deflection-amplifying portion 140, the material 131 is deposited such that its thickness increases in the directions away from the optical axis. For the condenser portion 136, the material 131 is deposited such that its thickness decreases in the directions away from the optical axis. The substrate 130 of the example of FIG. 41 is subjected to a thermal diffusion process at an elevated diffusion temperature. As a result, the convex lens portion or condenser portion 136, and the concave lens portion or deflection-amplifying portion 140, are concurrently produced as illustrated in FIG. 42. The substrate 130 formed with these portions 136, 140 may be used for the deflector device shown in FIGS. 26 and 27, the convex lens portion 136 serving as the condenser portion 86 while the concave lens portion 140 serving as the deflection-amplifying portion 90.

While several preferred embodiments of the present invention have been described, together with various modifications of their components, it is to be understood that the invention is not confined to the precise disclosure contained herein, but may be embodied with various other changes, modifications and improvements which may occur to those skilled in the art, without departing from the spirit and scope of the invention defined in the appended claims.

What is claimed is:

1. An optical deflector device for deflecting a light beam from a light source, over a predetermined angular range, comprising:
    a single substrate having a waveguide formed on one of opposite surfaces thereof, said waveguide having an electrooptic effect and guiding the light beam transmitted from said light source;
    a condenser portion provided in said waveguide for condensing a radiation of the light beam from said light source, into parallel rays;
    a deflector portion provided in said waveguide for deflecting the parallel rays, over said predetermined angular range;
    a converging portion comprising a plurality of mutually spaced-apart convergence electrodes disposed on said waveguide, to converge the deflected parallel rays from said deflector portion; and
    control means for controlling an operation of said deflector portion so as to deflect said parallel rays from said condenser portion as a function of time, over said predetermined angular range, and for applying convergence voltages to said convergence electrodes, said convergence voltages being varied as a function of time, depending upon an angle of deflection of said parallel rays by said deflector portion, to adjust a focal length of said converging portion according to said angle of deflection of said parallel rays by said deflector portion, so that the deflected parallel rays are converged on a surface of an object irrespective of said angle of deflection.

2. An optical deflector device according to claim 1, further comprising a deflection-amplifying portion, disposed between said deflector portion and said converging portion, for amplifying the angle of deflection of said parallel rays by said deflector portion, said deflection-amplifying portion comprising a portion of said waveguide whose refractive index is varied so that the deflection-amplifying portion serves as a concave lens.

3. An optical deflector device according to claim 1, wherein said deflector portion comprises a plurality of mutually spaced-apart deflection electrodes disposed on a portion of said waveguide, said control means applying deflection voltages to said deflection electrodes to produce an electric field for establishing a distribution of a refractive index of said portion of said waveguide in a transverse direction of said waveguide, said distribution of the refractive index corresponding to a distribution of a magnitude of said electric field due to said electrooptic effect of the waveguide, said control means changing said deflection voltages as a function of time to vary the distribution of said refractive index, thereby deflecting said light beam within said predetermined angular range.

4. An optical deflector device according to claim 1, wherein said deflector portion comprises an oscillator for generating elastic surface waves to which a portion of said waveguide is exposed, said control means changing periodically a frequency of said elastic surface waves to effect a periodic variation in refractive index of said portion of the waveguide, in timed relation with said frequency of the elastic surface waves, said periodic variation in refractive index causing a variation in angle of Bragg diffraction of said parallel rays, whereby an angle of deflection of the parallel rays by said deflector portion is varied with the frequency of said elastic surface waves.

5. An optical deflector device according to claim 1, wherein said plurality of mutually spaced-apart convergence electrodes of said converging portion are disposed on a portion of said waveguide and spaced apart a predetermined distance from each other in a predetermined direction intersecting a direction of propagation of the light beam through said waveguide, said convergence voltages establishing, due to the electrooptic effect of said waveguide, a sawtooth distribution of a refractive index of said portion of the waveguide in said predetermined direction, said control means varying said convergence voltages to change said sawtooth distribution of the refractive index, thereby adjusting said focal length of said converging portion according to a variation in said convergence voltages.

6. An optical deflector device according to claim 1, wherein said converging portion comprises a radial array of a plurality of three-dimensional waveguides which are disposed radially so as to cover said predetermined angular range, said plurality of mutually spaced-apart convergence electrodes being arranged such that portions of said three-dimensional waveguides are exposed to electric fields which are produced by the convergence electrodes by application of said convergence voltages thereto, said convergence voltages being varied to change magnitudes of said electric fields and to thereby change distributions of refractive indexes of said portions of the three-dimensional waveguides, whereby the beams of light emitted from said three-dimensional waveguides are focused on said surface of the object.

7. An optical deflector device according to claim 2, wherein said refractive index of said portion of the waveguide which constitutes said deflection-amplifying portion, increases in opposite transverse directions of said waveguide, away from an optical axis of the light beam.

8. An optical deflector for deflecting a light beam from a light source, over a predetermined angular range, comprising:
    a single substrate having a waveguide formed on one of opposite surfaces thereof, said waveguide having an electrooptic effect and guiding the light beam transmitted from said light source;
    a deflector portion provided in said waveguide for deflecting said light beam from said light source, over said predetermined angular range;
    a deflection-amplifying portion for amplifying an angle of deflection of the light beam by said deflector portion, said deflection-amplifying portion comprising a portion of said waveguide whose refractive index is varied so that the deflection-amplifying portion serves as a concave lens;
    a converging portion comprising a plurality of mutually spaced-apart convergence electrodes disposed on said waveguide, to converge the deflected light beam from said deflection-amplifying portion; and control means for controlling at least an operation of said deflector portion so as to deflect said light beam so that a total angle of deflection of the light beam by said deflector portion and said deflection-amplifying portion covers said predetermined angular range, said control means controlling said convergence electrodes to adjust a focal length of said converging portion according to said total angle of deflection of said light beam, so that the deflected light beam is converged on a surface of an object irrespective of said total angle of deflection.

* * * * *